United States Patent [19]

Sako

[11] Patent Number: 4,760,576
[45] Date of Patent: Jul. 26, 1988

[54] ERROR CORRECTION METHOD

[75] Inventor: Yoichiro Sako, Tokyo, Japan

[73] Assignee: Sony Corporation, Tokyo, Japan

[21] Appl. No.: 32,178

[22] Filed: Mar. 30, 1987

[30] Foreign Application Priority Data

Apr. 4, 1986 [JP] Japan .................................. 61-77696

[51] Int. Cl.$^4$ .............................................. G06F 11/10
[52] U.S. Cl. ......................................... 371/40; 371/37
[58] Field of Search ....................... 371/37, 38, 39, 40, 371/50, 2, 31

[56] References Cited

U.S. PATENT DOCUMENTS 4,336,612  6/1982  Inoue ..................................... 371/39
4,630,272 12/1986  Fukami .............................. 371/38 X
4,653,052  3/1987  Doi ......................................... 371/39

OTHER PUBLICATIONS

J. Marshall, "Delimiting Burst Errors", IBM TDB, vol. 18, No. 6, Nov. 1975, pp. 1730–1731.

Primary Examiner—Jerry Smith
Assistant Examiner—Robert W. Beausoliel
Attorney, Agent, or Firm—Philip M. Shaw, Jr.

[57] ABSTRACT

An error correction method for successively correcting burst errors which may occur in product-coded data while the data is successively transmitted along its row (or column) direction, in which 1-symbol errors are detected and corrected by a $C_2$ parity provided to correct data errors of the product-coded data in its column (or row) direction and which is capable of detecting and correcting 1-symbol errors and effecting an erasure correction on up to 2-symbol errors and in which when it is detected that a burst error has occurred, which cannot be corrected by a $C_1$ parity provided to correct data errors in the row (or column) direction, and such burst error extends over 3 rows (or columns), inherent 2-symbol errors within such burst error are detected from 3-symbol errors which are located in columns (or rows) before and after the columns (or rows) at which 1-symbol errors are detected and corrected by the $C_2$ parity with reference to detection information of the burst error detected by the $C_1$ parity and then an erasure correction is effected on such 2-symbol errors thus detected.

9 Claims, 2 Drawing Sheets

ERROR CORRECTION METHOD

BACKGROUND OF THE INVENTION

1. Field of the Invention

This invention relates generally to an error correction method, and more particularly to such a method which is capable of successfully correcting burst errors which possibly occur over a plurality of rows or columns of product-coded data while the product-coded data is sequentially transmitted along the row direction or column direction.

2. Description of the Prior Art

There is known in the art a method in which digital data is product-coded in order to correct data errors which will be caused when the digital data is transmitted (including recording/reproducing) through a transmission path. The product-coded data is such that a predetermined quantity or number of data to be transmitted are arranged in a two-dimensional array. A first error correcting code (hereinafter called "a $C_1$ parity") for correcting errors possibly occurring in the row direction of the two-dimensional array data is generated, a second error correcting code (hereinafter called "a $C_2$ parity") for correcting errors possibly occurring in the column direction of the two-dimensional array data is generated, and the first and second error correcting codes are added to the two-dimensional array data. The product-coded data thus formed is sequentially delivered, e.g. along the row direction, to a transmission path.

Since the $C_2$ parity is formed, e.g. of a two-byte Reed-Solomon code, it can detect and correct one symbol error as well as effect an erasure correction on up to 2-symbol errors. Let it now be assumed that while the product-coded data is sequentially transmitted along the row direction, a burst error occurs over 3 rows so that this burst error can no longer be corrected by the use of the $C_1$ parity. On such an occasion, a flag indicative of a data error is set to all data allocated in each of the rows containing the error. However, the $C_2$ parity can be applied to effect an erasure correction on up to 2-symbol errors only so that if a flag which indicates that there occurs a 3-symbol error is set to each data in the column direction, the erasure correction can no longer be effected on them by the $C_2$ parity.

OBJECTS AND SUMMARY OF THE INVENTION

Therefore, it is an object of the present invention to provide an error correction method which can effectively correct, by the use of a second correction code, a burst error which may occur when a product-coded data having a first error correcting code and a second error correcting code consisting of two bytes which can detect and correct a 1-symbol error and effect an erasure correction on up to 2-symbol errors, is sequentially transmitted along the direction in which the first error correcting code is produced.

It is another object of the invention to provide an error correction method in which even if a burst error occurs which can not be corrected by the first correcting code, each 1-symbol error is first detected and corrected by the use of the second error correcting code and then the erasure correction is effected on 2-symbol errors on the basis of the result of the error correction effected using the first error correction code, to thereby enhance the error correction ability of the error correcting method.

It is a further object of the invention to provide an error correction method in which even if a flag indicative of the existence of a 3-symbol data error is set to data subjected to data correction by the use of the second error correcting code on the basis of the result of data correction effected by the use of the first error correction code, it is determined whether the error indicated by the flag is a true data error or a false data error, and if the error is determined to be a true 2-symbol error, an erasure correction is effected on the error by the use of the second error correcting code.

According to the present invention these objectives are achieved by an error correction method for a predetermined number of data arranged in a two-dimensional matrix, the method being of the type wherein a first error correcting code is produced for data arranged in a first direction of the two-dimensional matrix of data and added to the two-dimensional matrix of data, and a second error correcting code is produced for data arranged in a second direction of the two-dimensional matrix of data different from the first direction and added to the two-dimensional matrix of data, the second error correcting code being capable of detecting and correcting 1-symbol errors and effecting an erasure correction on up to 2-symbol errors, the method further being adapted to correct errors which will occur in the two-dimensional matrix of data with the first error correcting code and the second error correcting code when the two-dimensional data is transmitted along the first direction, comprising the steps of:

(a) detecting that an error occurs over three successive lines in the first direction;

(b) detecting and correcting 1-symbol errors in the second direction by the use of the second error correcting code;

(c) detecting that the 1-symbol errors detected and corrected by the second error correcting code are located in the center line of the three successive lines; and (d) effecting an erasure correction by the use of the second error correcting code on 2-symbol errors in first and center lines of the three lines and 2-symbol errors in the center and third lines of the three lines which cannot be corrected by the second error correcting code when it is detected at step (c) that the 1-symbol errors are located in the center line.

These and other objects, feature and advantages of the present invention will become apparent from the following detailed description of the preferred embodiment taken in conjunction with the accompanying drawings, throughout which like reference numerals designate like elements and parts.

DESCRIPTION OF THE PREFERRED EMBODIMENT

Now, an embodiment of an error correction method according to the present invention will hereinafter be explained, wherein data is recorded on and reproduced from a recordable and reproducible magneto-optical disc as an example. First, however, the magneto-optical disc and an example of a data format therefor will be explained.

Besides the optical disc referred to as a Write Once (WO) disc on which data can be recorded only once, there is also a magneto-optical disc on which data can be repeatedly recorded and reproduced as a data storage medium for a computer.

Figure 1:
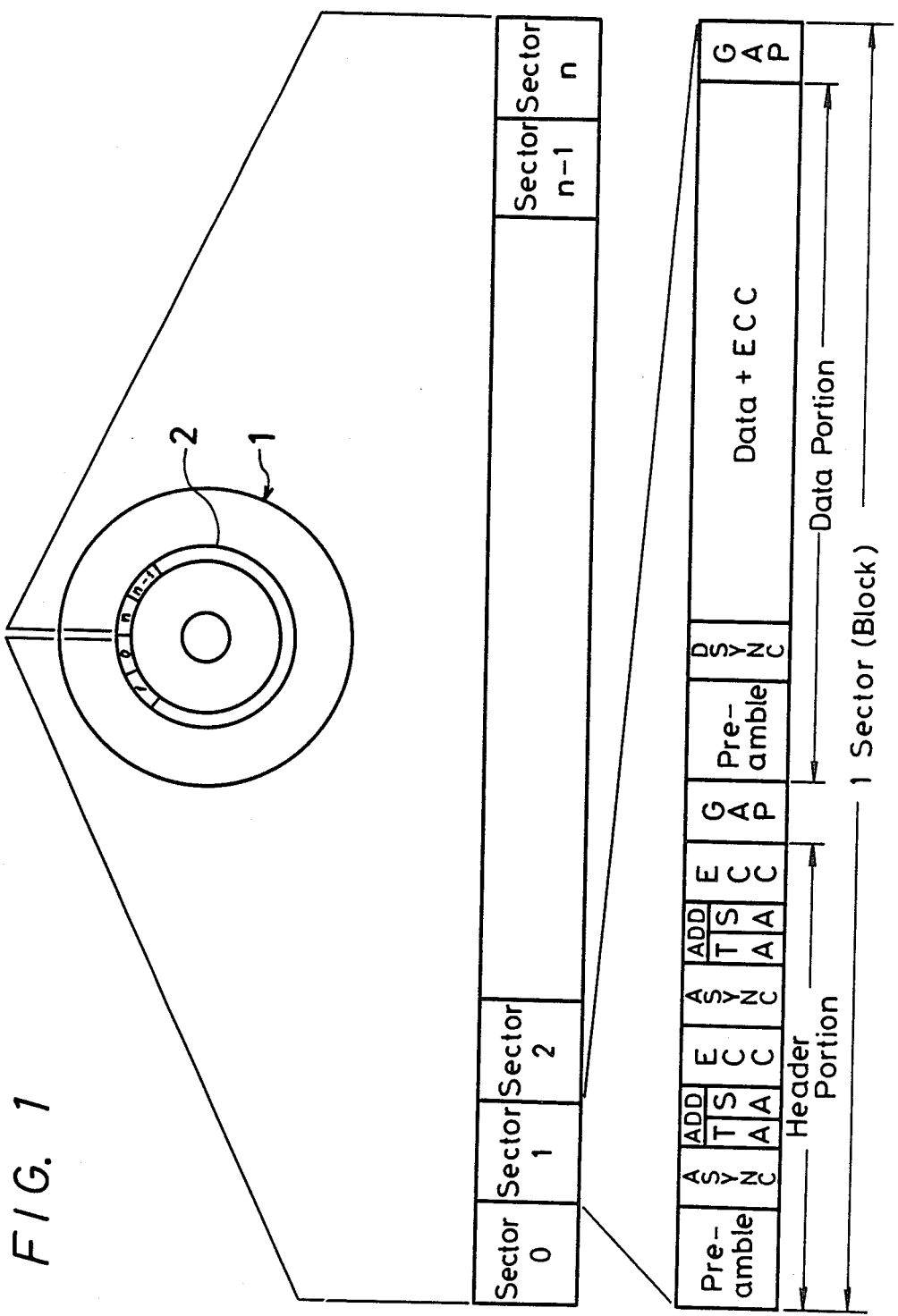
FIG. 1 is a diagram schematically showing an example of a data format of a magneto-optical disc.

The magneto-optical disc 1, as shown in FIG. 1, is rotated at a constant angular velocity so that data is recorded and reproduced on and from tracks 2 concentrically or spirally formed on the magneto-optical disc 1. Each of the tracks 2 is divided into a plurality of sectors in its circumferential direction and on each of the sectors there are recorded a predetermined number of data.

In the example of FIG. 1, a single track 2 is formed of (n+1) sectors. Each sector comprises a header portion, a data portion, and gap portions GAP provided behind each of the header portion and the data portion.

In the header portion, there is located a preamble signal at its head and following thereto there are twice written the combination of an address signal ADD comprising a track address data TA and a sector address data SA with an address synchronizing signal ASYNC and an error correcting code ECC.

In the data portion, there are positioned a preamble signal and a data synchronizing signal DSYNC at its head as well as following thereto, data and an error correcting code ECC for the data and so on.

The number or quantity of data to be recorded in the data portion of one sector, that is, a data capacity of one sector is generally determined as 512 bytes when the disc is used as a storage device for a computer. However, recently, the data capacity has been increased to 1 kbytes, 2 kbytes or 4 kbytes, and so on, as the case may be.

When an error correction method is employed for the data recorded in one sector as mentioned above, the data portion in one sector is constructed in the manner now to be described. A predetermined unit quantity of data, for example, 512 bytes, 1 kbytes, 2 kbytes and so on, is arranged in a matrix form, a first parity $C_1$ for error correction is added to the data arranged in the row direction of the matrix, and a second parity $C_2$ for error correction is added to the data arranged in the column direction of the matrix, whereby the error correcting codes are formed for the predetermined data recorded in each sector. As an example of such an error correcting code, there is considered a product code which is hereinafter explained.

Figure 2:
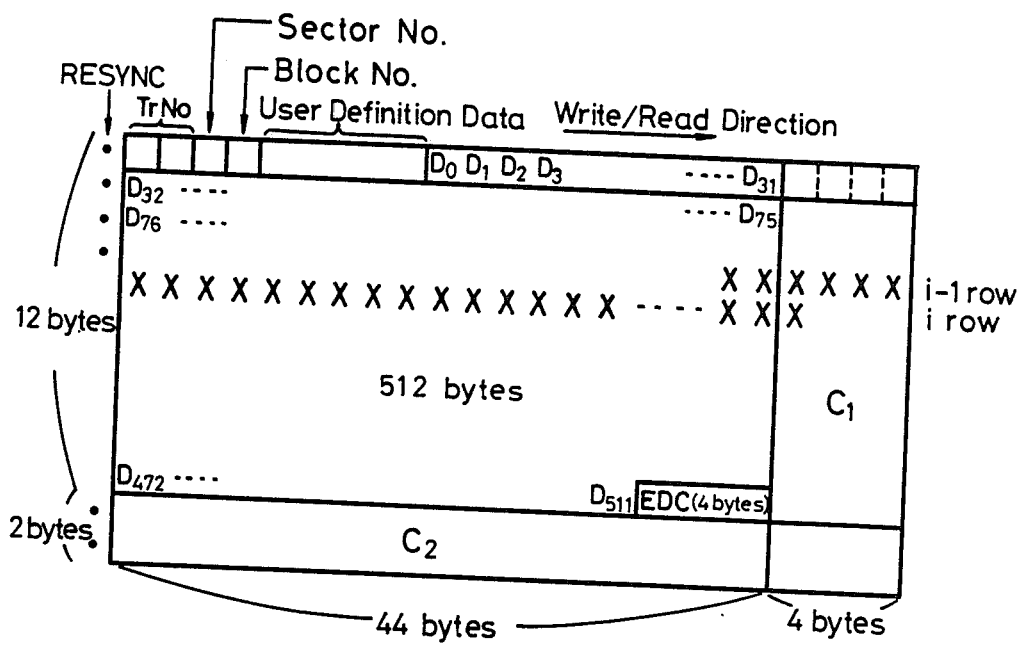
FIG. 2 is a diagram showing an example of a data block construction to which is applicable an error correction method according to the present invention.

FIG. 2 shows an example of a construction of data to be recorded in respective sectors of each track 2 on the aforementioned magneto-optical disc, wherein the predetermined quantity or number of the data to be recorded in one sector is determined as 512 bytes.

As shown in FIG. 2, prior to the 512 bytes of data $D_0$–$D_{511}$, there is added 12-bytes of supplementary information including a track number, a sector number, a block number and so on. A 4-byte error detecting code (EDC) is produced for these 524-bytes of data. For example, a CRC (Cyclic Redundancy Check) code is added after data $D_{511}$ of the 524-bytes of data in such a manner that a total of 528-bytes (44×12) of data is arranged in a matrix form, as shown in FIG. 2.

Then, as the first parity $C_1$ for error correction, 4 check symbols (4 bytes) produced from (48, 44) Reed-Solomon code, for example, are added to 44-bytes of data (symbols) arranged in each of the rows of the 528-byte data matrix including the 4-bytes of EDC (Error Detecting Code). In other words, the parity $C_1$, the redundancy of which is 4 bytes in the row direction, is added to the extended portion of each row of data.

A synchronizing signal (hereinafter called "RESYNC") indicative of the head of each row is added to each row at its head.

Further, as the second parity $C_2$ for error correction, 2 check symbols (2 bytes) produced from (14, 12) Reed-Solomon code, for example, are added to the 12-bytes of data (symbols) arranged in each of the columns of the 528-byte data matrix. In other words, the parity $C_2$, the redundancy of which is 2 bytes in the column direction, is added to the extended portion of each column of data.

Thus, the data to be recorded is transformed into product-coded data and then recorded in each of the sectors. Writing and reading of the product-coded data in and from an encoder and a decoder are done along the row direction as shown in FIG. 2, and sequentially from the uppermost row to the lowermost row.

In the case of this example, the data matrix is arranged such that the row is longer than the column, each row having 44 bytes and each column 12 bytes, and the parity $C_2$ is added to data arranged in the column direction, so that the resulting product-coded data is effective in regard to burst errors.

Further in this example, the parity $C_1$ is a Reed-Solomon code, the minimum distance of which is 5, so that it can detect and correct 2-symbol (byte) errors for the data in the row direction as well as detect 4-symbol (byte) errors for the same data in the row direction. On the other hand, the parity $C_2$ is a Reed-Solomon code, the minimum distance of which is 3, so that it can detect and correct 1-symbol (byte) errors as well as detect 2-symbol (byte) errors for the data in the column direction as well as effect an erasure correction on up to 2-symbol errors.

Symbols "X" in FIG. 2 mark the occurrence of a burst error in the data from a row (i−1) to a row i which cannot be corrected by the use of the $C_1$ parity. An effective method for correcting such a burst error will now be considered. First, a flag indicative of a data error is set to each data located in the rows (i−1) and i, or the rows themselves, when more than three errors exist in each such row which cannot be corrected by the $C_1$ parity. Next, each 1-symbol error is detected and corrected by the use of the $C_2$ parity, while as to 2-symbol errors, their error symbol positions are specified with reference to the flags set by the use of the $C_1$ parity and then an erasure correction is carried out for such data errors. This method renders it possible to correct, by the $C_2$ parity, burst errors existing over two successive rows that cannot be corrected by the $C_1$ parity.

Figure 3:
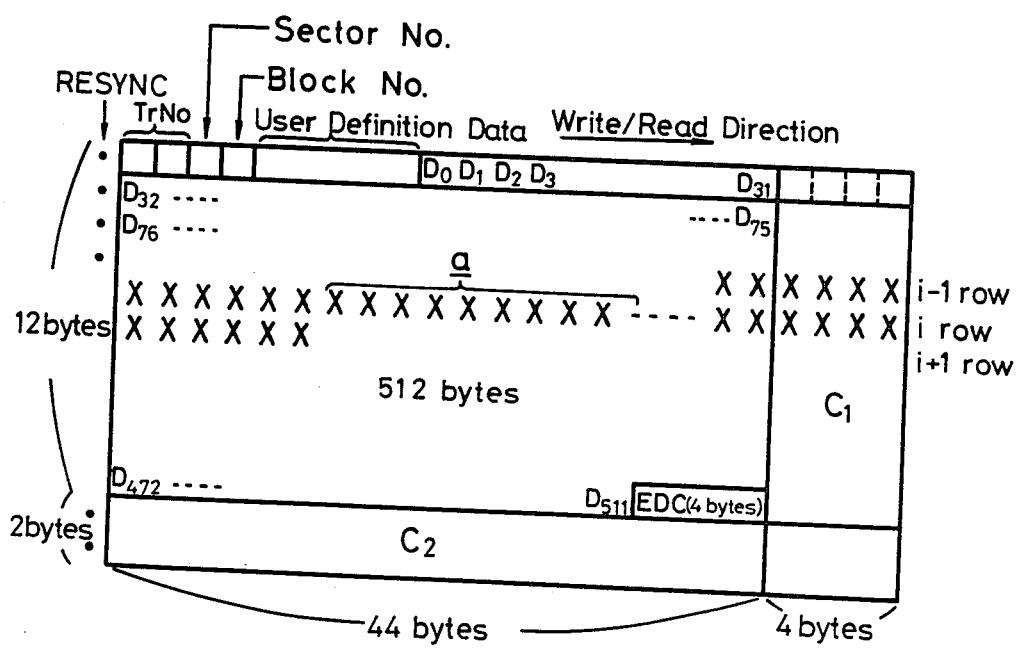
FIG. 3 is a diagram used to explain an error correction method according to the present invention.

Let it now be assumed that while using a method in which the error correction is first carried out with respect to data arranged in the row direction by the use of the $C_1$ parity and then to data arranged in the column direction by the use of the $C_2$ parity, there occurs a burst error wherein erroneous data successively exist from the row (i−1) to the row (i+1) without any other error in other rows or with the other errors in other rows which can be corrected by the $C_1$ parity having all been corrected. FIG. 3 is a diagram showing such a case wherein a burst error that cannot be corrected by the $C_1$ parity occurs over three successive rows.

When the error correction is effected using the $C_1$ parity, a flag indicative of a data error is set to each of the erroneous data in the rows $(i-1)$, $i$ and $(i+1)$ or the rows themselves since the $C_1$ parity cannot correct 3-symbol (data) errors. When uncorrectable errors of more than 3 bytes occur in each row of three successive rows, it is assumed that there appears a burst error. In the present embodiment the $C_1$ parity is used as a technique to detect that the burst error exists over three successive rows. However, other suitable techniques may be used for this purpose.

For example, in a system which effects a data conversion or modulation such as a so-called 8-10 conversion upon recording data on a disc, when the converted data is subjected to the conversion process to be recovered to byte-unit data by the 10-8 conversion upon reproducing, if there exists successively a so-called out-of-rule 10-bit data which is not in an 10-8 conversion table or map, the period in which the out-of-rule 10-bit data succeeds can be considered as a burst error occurring location. Further, this detection of burst error occurring location on the basis of the existence of out-of-rule data in the 10-8 conversion and that detection by the use of the $C_1$ parity, as mentioned above, may be combined to detect a burst error occurring location in data arranged in a matrix form.

Next, error correction is effected by using the $C_2$ parity. Errors occurring in data positioned at a middle portion of the row $i$ are 1-symbol errors so that they could be corrected by the $C_2$ parity. However, since the flag indicative of a data error is respectively set to the data in the rows $(i-1)$, $i$ and $(i+1)$, all data in the three rows is assumed as an error and thus each column is assumed to have a three symbol error extending over these rows. Therefore, even an erasure correction cannot be effected as to these errors by using the $C_2$ parity.

Thus, a maximum correctable burst error length for the case wherein only error detection and error correction are effected using the $C_1$ and $C_2$ parities in the example of FIG. 3 is calculated by adding [(the number of bytes which can be detected and corrected by the $C_1$ parity)$\times 2+1$] to [(the number of bytes which can be detected and corrected by the $C_2$ parity)$\times$(the number of bytes contained in one row)], e.g. 53 bytes in the example of FIG. 3. However, according to the present invention, the maximum correctable burst error length can be increased as hereinafter explained.

First, 1-symbol errors in the column direction, occurring at the middle portion of the row $i$ in FIG. 3, are detected and corrected by the $C_2$ parity and at the same time the locations of the error are stored in memory. In this case, it is detected by the use of the $C_2$ parity that the data positioned on the row $i$ which can be detected and corrected by the $C_2$ parity exceed a value a (e.g. 10) and the detection result may be used as information for assuming beginning and end of the aforementioned occurrence of the burst error.

An erasure correction is next effected using the $C_2$ parity on erroneous, but correctable data located in the rows $i$ and $(i+1)$ before the first data of the data a in the row $i$ which could be corrected, that is, erroneous data in the rows $i$ and $(i+1)$ at columns before the column at which the first erroneous data of the data a is located. In the same manner, an erasure correction is effected using the $C_2$ parity on erroneous data in the rows $(i-1)$ and $i$ located after the last data of the data a in the row $i$ which could be corrected, that is, erroneous, but correctable data in the rows $i$ and $(i-1)$ located at columns after the column at which the last erroneous data of the data a is located.

As is understood from the explanation given above, it is detected that the burst error occurs over a zone from the row $(i-1)$ to the row $(i+1)$ by using $C_1$ parity as well as the location of the 1-symbol errors which have been detected and corrected by the $C_2$ parity. Therefore, it is understood that the remaining erroneous data are the data in the right portion of the rows $(i-1)$ and $i$ and in the left portion of the rows $i$ and $(i+1)$ in FIG. 3. Therefore, even if a burst error which cannot be corrected by the $C_1$ parity occurs over three successive rows and hence the error flag is set to the respective data located in each of the three rows, true 2-symbol errors are specified and subjected to erasure correction by detecting and correcting the 1-symbol errors by using the $C_2$ parity.

In this instance, the data which can be detected and corrected by the $C_2$ parity is successive for a symbols in the portion where the burst error occurs and it is possible to effect the erasure correction on the true error data over the two rows before and after the correction position. Therefore, the maximum correctable burst error length is increased by about a byte length of the row, compared with a conventional method in which errors are detected and corrected by the $C_1$ and $C_2$ parities. To be specific, in the above example, the maximum correctable burst error length which was 53 bytes in the prior art is increased to 96 bytes using the method of the present invention. If the quantity of 1-symbol errors which are detected and corrected by the $C_2$ parity is assumed to be a, the correctable burst error length is calculated as $(96-a)$ bytes.

Incidentally, in the example given above, the transmission direction or recording/reproducing direction of data is perpendicular to the production direction of the $C_2$ parity. However, the present invention can also be applied to the case where these two directions are not perpendicular to each other.

The present invention can further be applied to the case where the data transmission direction is in an oblique direction.

The present invention can still further be applied to the case where the $C_2$ parity is solely added to the data array in the column direction or the $C_1$ parity is solely added to the data array in the row direction. It should be noted, however, that when the $C_1$ parity in the row direction is solely added, the data transmission direction is determined as the column direction or oblique direction.

When computer data or the like is concerned, a sector in which the erasure correction has been effected may be subjected to an error detection by an error detecting code (EDC) to judge whether or not the sector contains errors. If errors are detected, the data in the sector may not be used.

Further, it will be easily understood, that according to the present invention the row direction and the column direction can be replaced with each other with the same effect. That is to say, the terms "row" and "column" are relative to each other and are not absolute terms.

As described above, according to the present invention, in order to correct a burst error which occurs over three successive rows $(i-1)$, $i$, and $(i+1)$ in the product-coded data converted from a predetermined quantity or number of data when it is transmitted, the $C_2$ parity, which can correct 1-symbol errors in the column direction or achieve an erase correction of up to 2-symbol errors, is used to detect and correct 1-symbol errors at the middle portion of the row i and when the 1-symbol errors are found, even if a burst error which can not be corrected by the $C_1$ parity occurs over three successive rows and hence the flag is set to all the data in the respective three rows which are assumed to be all erroneous, it can be determined that 2-symbol errors actually exist in the rows i and (i+1) at the columns before the column at which the first 1-symbol error can be detected and corrected and that 2-symbol errors actually exist in the rows (i−1) and i at the columns after the column at which the last 1-symbol error can be detected and corrected. Then, an erasure correction can be effected on these 2-symbol errors. Hence, even when it is detected that a burst error occurs over three successive rows (i−1), i and (i+1), if there are 1-symbol errors which can be detected and corrected by the $C_2$ parity in the median row (the row i), it is assured that the burst error will be corrected.

The above description is given on a single preferred embodiment of the invention but it will be apparent that many modifications and variations could be effected by one skilled in the art without departing from the spirit or scope of the novel concepts of the invention so that the scope of the invention should be determined by the appended claims only.

I claim as my invention:

1. An improved error correction method for a predetermined number of data arranged in a two-dimensional matrix, the method being of the type wherein a first error correcting code is produced for data arranged in a first direction of said two-dimensional matrix of data and added to said two-dimensional matrix of data, and a second error correcting code is produced for data arranged in a second direction of said two-dimensional matrix of data different from said first direction and added to said two-dimensional matrix of data, said second error correcting code being capable of detecting and correcting 1-symbol errors and effecting an erasure correction on up to 2-symbol errors, said method enabling correction of errors which will occur in said two-dimensional matrix of data with said first error correcting code and said second error correcting code when said two-dimensional data is transmitted sequentially taken along said first direction, comprising the steps of:
   (a) detecting that errors occur over three successive lines taken in said first direction;
   (b) detecting and correcting 1-symbol errors which were in said second direction by the use of said second error correcting code;
   (c) detecting that the 1-symbol errors detected and corrected by said second error correcting code are located in the center line of said three successive lines; and
   (d) effecting an erasure correction by the use of said second error correcting code on 2-symbol errors in the first and the center lines of said three lines and on 2-symbol errors in the center and the third lines of said three lines which cannot be corrected by said second error correcting code when it is detected at step (c) that the 1-symbol errors are located in the center line.

2. An error correction method as claimed in claim 1, wherein said errors occurring over the three successive lines in the first direction are detected by the use of said first error correcting code.

3. An error correction method as claimed in claim 1, wherein said first and second error correcting codes are respectively Reed-Solomon codes.

4. An error correction method for a predetermined number of data arranged in a two-dimensional matrix, wherein a first error correcting code is produced for data arranged in the row (or column) direction of said two-dimensional matrix of data and added to said two-dimensional matrix of data, and a second error correcting code is produced for data arranged in the column (or row) direction of said two-dimensional matrix of data and added to said two-dimensional matrix of data to form a so-called product-coded data, said second error correcting code being capable of detecting and correcting 1-symbol errors and effecting an erasure correction on up to 2-symbol errors, said method being adapted to correct errors which will occur in said product-coded data with said first error correcting code and said second error correcting code when said product-coded data is transmitted along said row (or column) direction, comprising the steps of:
   (a) detecting that an error occurs over three successive lines in the row (or column) direction;
   (b) detecting and correcting 1-symbol errors in the column (or row) direction by the use of said second error correcting code;
   (c) detecting that the 1-symbol errors detected and corrected by said second error correcting code are located in the center line of said three rows (or column); and
   (d) effecting an erasure correction by the use of said second error correcting code on 2-symbol errors in first and center lines of said three rows (or columns) and 2-symbol errors in the center and last lines of said three rows (or columns) which cannot be corrected by said second error correcting code when it is detected at step (c) that the 1-symbol errors are located in the center line of said three rows (or column).

5. An error correction method as claimed in claim 4, wherein said error occurring over three successive lines of said rows (or columns) in the row (or column) direction is detected by said first error correcting code.

6. An error correction method as claimed in claim 4, wherein said first and second error correcting codes are Reed-Solomon codes, respectively.

7. An improved method for correcting errors which occur during the transmisssion of data, the data originally having been arranged in groups of a predetermined number in two-dimensional matrixes each of which includes a first error correcting code for data arranged in rows and a second error correcting code for data arranged in columns, said second error correcting code being capable of detecting and correcting 1-symbol errors and effecting an erasure correction on up to 2-symbol errors, said data being transmitted from each of said matrixes taken sequentially along said rows, comprising the steps of:
   (a) detecting the occurrence of errors extending over three successive rows;
   (b) detecting and correcting all 1-symbol errors in those of the columns which contain such 1-symbol errors by the use of said second error correcting code;
   (c) detecting that the 1-symbol errors detected and corrected by said second error correcting code are located in the center row; and (d) effecting an erasure correction by the use of said second error correcting code on 2-symbol errors in the remaining columns.

8. An error correction method as claimed in claim 7, wherein step (d) comprises the steps of effecting an erasure correction by the use of said second error correcting code on 2-symbol errors in the first and the center rows of said three rows and on 2-symbol errors in the center and the third rows of said three rows which cannot be corrected by said second error correcting code when it is detected at step (c) that 1-symbol errors are located in the center row.

9. An improved method for correcting errors which occur during the transmisssion of data, the data originally having been arranged in groups of a predetermined number in two-dimensional matrixes each of which includes a first error correcting code for data arranged in rows and a second error correcting code for data arranged in columns, said second error correcting code being capable of detecting and correcting 1-symbol errors and effecting an erasure correction on up to 2-symbol errors, said data being transmitted from each of said matrixes taken sequentially along said rows, comprising the steps of:

(a) detecting the occurrence of errors extending over three successive rows;

(b) detecting and correcting all 1-symbol errors in those columns which intersect the second of said three successive rows by the use of said second error correcting code and storing the locations of the beginning and end of said 1-symbol correctable errors, said beginning and end locations defining a middle portion of said second row; and (c) erase correcting, by the use of said second error correcting code, 2-symbol errors in the columns intersecting a right portion of the first and second of said successive rows and a left portion of the second and third of said successive rows, said right and left portions combining with said middle portion to make up the whole of the second row.

* * * * *